United States Patent [19]

Cordwell et al.

[11] Patent Number: 4,692,713
[45] Date of Patent: Sep. 8, 1987

[54] READ ONLY MEMORY CONTROL CIRCUIT FOR USE IN A PHASE LOCK LOOP

[75] Inventors: Brian Cordwell, Merley; Paul M. Hayes, Poole, both of England

[73] Assignee: Plessey Overseas Limited, Ilford, England

[21] Appl. No.: 807,629

[22] Filed: Dec. 11, 1985

[30] Foreign Application Priority Data

Dec. 21, 1984 [GB] United Kingdom ............... 8432552

[51] Int. Cl.$^4$ ..................... H03L 7/08; H03M 1/70
[52] U.S. Cl. .................................. 331/1 A; 328/27; 331/17; 331/25; 340/347 DA; 365/189; 365/230
[58] Field of Search ................ 331/1 A, 14, 17, 20, 331/25; 365/73, 189, 230, 94; 340/347 DA; 328/27, 155

[56] References Cited

U.S. PATENT DOCUMENTS 3,772,681 11/1973 Skingle .......................... 328/27 X
4,318,188 3/1982 Hoffmann ........................ 365/45
4,443,767 4/1984 Reichert et al. .................. 328/155
4,450,538 5/1984 Shirasaka ..................... 365/189 X
4,533,879 8/1985 Sauer et al. ..................... 331/1 A Primary Examiner—Siegfried H. Grimm
Attorney, Agent, or Firm—Michael F. Oglo; Julian C. Renfro

[57] ABSTRACT

A control circuit comprising a read-only memory has its storage area divided into two areas each containing the same number of addressasble words. By arranging that input of a single address signal causes a change from addressing a particular wood in one area to addressing a corresponding word in the other area, and by programming a fixed difference in value between corresponding words in the two areas causes a step function in the output. Using a digital to analogue converter on the output of the circuit permits a step change in a voltage output to be provided to (e.g.) a voltage controlled oscillator. A control circuit using a read-only memory as a voltage comparator is also disclosed.

7 Claims, 4 Drawing Figures

READ ONLY MEMORY CONTROL CIRCUIT FOR USE IN A PHASE LOCK LOOP

FIELD OF THE INVENTION

The present invention relates to control circuits and more particularly to control circuits which provide a plurality of digitally encoded electrical signal outputs.

BACKGROUND OF THE INVENTION

In many control applications digital signals are received from a part of an electrical or electronic circuit which have an effect on another part of that circuit to alter the ultimate output thereof. In some cases the received digital signals are of the kind known as "feedback" signals returned from a comparison device which compares the output of the circuit with a fixed reference.

One well known kind of circuit which utilizes feedback signals is a phase-lock loop in which an output signal generated by an oscillator is compared in phase and/or frequency with an input signal. A digital signal from the comparison device is then used to control the frequency of the oscillator. For example a digital-to-analogue converter may be used to convert the signal from the comparison device to an analogue voltage which is used to control a voltage controlled oscillation.

However, if a significant phase difference is present the time taken to adjust the output phase of the oscillator may be comparatively long. It would be advantageous to provide a rapid change to the control signal to effect a brief increase or decrease in the output oscillation to bring the output into phase alignment. When a digital-to-analogue converter is used to generate the controlling analogue system provision of such a change has required increasing the digital information rate which is not always easy to provide.

It is an object of the present invention to provide a simple control circuit capable of providing a digital control signal output the digital value of which may be changed more rapidly than was practical in the earlier systems outlined above.

SUMMARY OF THE INVENTION

According to the present invention there is provided a control circuit comprising: an addressable memory device, storage capacity of which is programmed in two areas of equal address length; the circuit being arranged to cause output of a digital word from the memory device in dependance upon digital signals applied to address inputs thereof; one of the programmed areas storing a first plurality of digital words arranged in an address order and the other of said programmed areas storing a second plurality of digital words arranged in a corresponding address order; words stored in corresponding address locatations of the two areas having a predetermined difference between each other; and, the memory device is arranged to output an addressed word from one of the areas when a signal is present on a particular one of said address inputs and to output an addressed word from the other of the areas when a signal is not present on said particular one of said address inputs whereby application or removal of a signal from said particular one of said address inputs effects a predetermined step change in the digital value of the output of the control circuit.

Preferably one of said areas is programmed with each of said digital words identical with its address such that when said signal on said particular one of said address inputs is not present the memory device appears transparent to the applied digital input signals.

Further areas of equal address length may also be provided with words stored in corresponding locations in each such area having a different predetermined difference from the words stored in the first said programmed area whereby a plurality of selectable predetermined step changes in the digital output of the control circuit may be achieved.

In one embodiment the control circuit also comprises a digital-to-analogue converter supplied by the output of said memory device whereby a step change may be produced in an analogue voltage output.

According to a feature of the invention there is provided a signal generator comprising a voltage controlled oscillator, a phase detector responsive to comparison between the output signal of the oscillator and a reference signal to produce a digital output signal representing any phase difference therebetween, a control circuit in accordance with the invention responsive to the digital output signal of the phase detector to provide a respective digital output signal, and a digital to analogue converter responsive to the digital output signal from said control circuit to provide a voltage signal to control the output frequency of the oscillator such that any significant phase difference may be corrected by application of a single additional input to the control circuit to cause a step change in the voltage output of the digital to analogue converter thereby, causing a step change in the output frequency of said oscillator.

According to another feature of the present invention there is provided a control circuit comprising an addressable memory device which has an address range addressed by n address inputs of the device, the address inputs are divided into two groups each comprising n/2 address inputs and each word written in the memory is pre-programmed to provide an output when addressed by n/ digital inputs which output depends upon an effective comparison between the two groups of n/2 digital inputs present.

Preferably each n/2 address group is derived from the output of an analogue to digital converter whereby the output of the control circuit depends upon a comparison between two analogue input signals.

Control circuit and a signal generator in accordance with the invention will now be described by way of example only with reference to the accompanying drawings.

DESCRIPTION OF THE PREFERRED EMBODIMENTS

Figure 1:
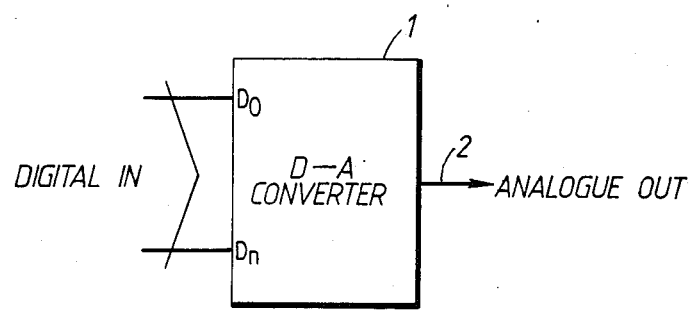
FIG. 1 is a schematic diagram of a digital to analogue converter.

Referring to FIG. 1 a digital to analogue converter 1 operating in known manner is shown. In the digital-to-analogue converter 1 a digital signal present at the input Do-Dn (usually in binary form) provides a voltage output signal on a single output lead 2. The voltage output signal varies in dependance upon the digital value of the signal at the input with say a binary signal of all zero (0) values at the input Do-Dn being represented by say a zero voltage at the output 2 and a binary signal of all one (1) values at the input Do-Dn being represented by, say, five volts at the output 2. Intermediate values of the input signal provide correspondingly scaled output voltages.

To produce a 'step' change in the output voltage it is necessary to provide a significant change in the digital value of the input signal applied to the input leads Do-Dn. If, say, a one volt step is required at the output 2 the digital value applied at the input leads Do-Dn must be changed rapidly to a new value and the value change required may vary in dependance upon the position of the value between the minima and maxima.

Figure 2:
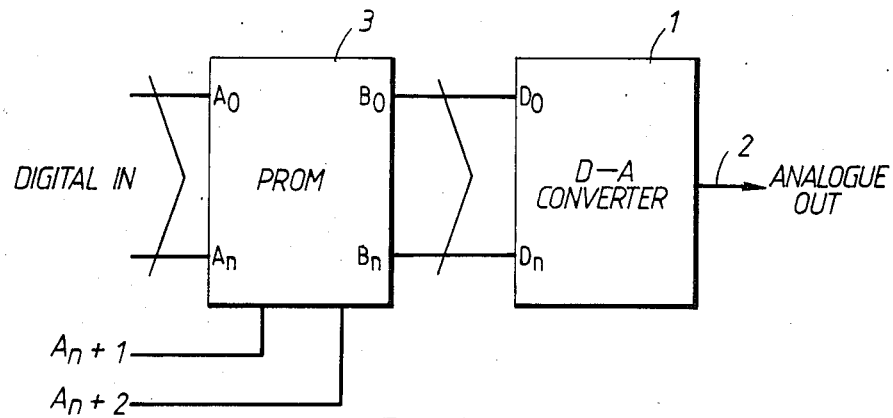
FIG. 2 is a schematic diagram of a control circuit in accordance with the invention, shown in use with the digital to analogue converter of FIG. 1.

Referring to FIG. 2 the control circuit shown can simply and effectively provide step changes in the voltage at the output 2 by varying the digital input on the leads Do-Dn.

Thus address inputs Ao-An of a programmable read-only-memory (PROM) 3 receive the same circuit signals as those applied to Do-Dn of the digital to analogue converter 1. In addition to the address inputs Ao-An, other address inputs A(n+1) and A(n+2) of the PROM 3 are used.

The storage of the PROM 3 is programmed such that words addressed by signals on the inputs Ao-An when the inputs A(n+1) and A(n+2) carry the binary representation '0' output their address value to output leads Bo-Bn thereby providing that digital value to the inputs Do-Dn of the digital to analogue converter 2. Thus the PROM 3 appears "transparent" to the signals and a circuit including the PROM 3 with the digital to analogue converter 1 will function in exactly the same manner as if only the digital to analogue converter 1 was present.

However, should it be necessary to effect an adjustment of the value supplied to the digital to analogue converter such adjustment may be effected by programming the words addressed by Ao-An with A(n+1) and A(n+2) to effect that adjustment.

It will be appreciated that, in the case of the PROM 3 having two additional address leads A(n+1) and A(n+2) and assuming that binary addressing is being used, only one quarter of the available memory space has been occupied.

Accordingly the words addressed when A(n+1) is at binary value '1' and A(n+2) is at binary value '0', when A(n+1) is at binary value '0' and A(n+2) is at binary value '1' and when both A(n+1) and A(n+2) are at binary value '1' are available as three "stores" equal in size to the memory space already occupied.

Thus each of these additional stores is programmed to reflect a step change in the value of the digital output on leads Bo-Bn thereby effecting a step change in the output voltage at the output 2.

Consider as an example a PROM having six address inputs AO to A6 and three outputs BO-B3 then the PROM may be programmed to provide a fixed difference in the digital output value in accordance with the following table:

| Data In | Operands | Data Out |
|---------|----------|----------|
| A0–A3   | A4,A5,A6 | B0–B3    |

| Data In | Operands | Data Out |
|---------|----------|----------|
| DATA | 0 0 0 | DATA |
| DATA | 0 1 0 | DATA − One (decimal) |
| DATA | 1 1 0 | DATA + One (decimal) |
| DATA | 0 1 1 | DATA − Ten (decimal) |
| DATA | 1 1 1 | DATA + Ten (decimal) |

In this case only five of the possible eight combinations of the operands A4–A6 have been used, thus three further output variations may be provided. However, if only five variants are required, the stored words provided by the "surplus" addresses may be programmed to output Ao to A3 in the same manner as when A4, A5 and A6 are at zero.

When the PROM 3 is programmed in the manner shown it will be appreciated that it may be used to provide fine and coarse adjustments of the output. Thus, A5 being set to '1' indicates that an output "step" is required, A4 indicates when '0' that a negative "step" is required and when set to '1' that a positive step is required, and A6 indicates that the step is to be fine (plus or minus one decimal) or coarse (plus or minus ten decimal) for '0' and '1' respectively.

In an alternative mode of operation percentage steps may be used in the same manner. Thus memory space of the PROM 3 addressed by "000A3A2A1Ao" may be output as aforesaid while "010A2A1Ao" may output (AoA1A2A3 less five percent) and "011A3A2A1Ao" may output (AoA1A2A3 plus five percent). A "coarse" adjustment of, say, fifteen percent may be provided when A6 is set to 1.

It will be realised that other scaling adjustments may also be used possibly with a variation of the adjustment across the address range or with adjustment being effected only for certain areas of the address range.

While as hereinbefore described adjustment is effected by use of the most significant bits of the address input Ao-An A(n+1) A(n+2) it will be appreciated that any one or more of the address bits may be used to effect such adjustment since for example groups of words in the PROM 3 may all relate to one particular basic address value, the most significant bits of the address being used for basic addressing and the least significant bits being used for data adjustment.

Figure 3:
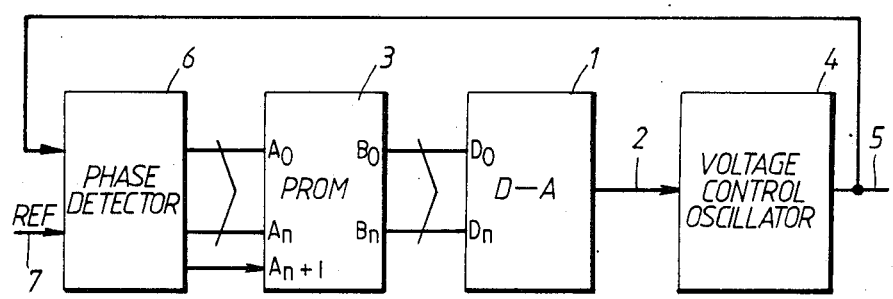
FIG. 3 shows a signal generator including a phase lock loop which uses the control circuit of FIG. 2; and, FIG. 4 is a schematic diagram of a control circuit in accordance with the invention shown in use as a comparator.

Referring now to FIG. 3, one specific use of the control circuit of FIG. 2 is in a phase lock loop. An oscillator 4 of the kind the frequency of which is dependant on a voltage applied at an input thereof supplies an output 5 with an oscillatory signal. Part of the output signal from the voltage controlled oscillator (VCO) 4 is fed back to a phase detector 6 which compares the phase of the output signal with the phase of a reference signal supplied to an input 7.

The phase detector 6 produces a digital output signal which represents the phase difference between the output and reference signals. The digital output signal is passed to the address inputs Ao-An of the PROM 3 which responds in the manner of the control circuit of FIG. 2 to provide an appropriate digital signal to the digital to analogue converter 1 the output of which controls the VCO4.

Should the phase detector 6 detect an excessive phase difference between the output and reference signals it is arranged to cause a signal to be applied briefly to the address input A(n+1) which causes, as hereinbefore described, a step change in the voltage signal thereby causing an increase or decrease in the frequency of the output signal on the lead 5.

The signal on the address input A(n+1) is applied briefly so that the VCO4 produces a frequency "kick" after which the signal at the input A(n+1) is removed returning the control voltage to its previous level. The frequency of the VCO4 therefore returns to its previous value with a different phase. The more usual phase correction procedure may now be used to maintain phase synchronism between the output and reference signals.

While as herein described the PROM 3 is used, any other suitable memory device may be used, for example, other kinds of read-only memory (ROM) such as EPROMs.

Figure 4:
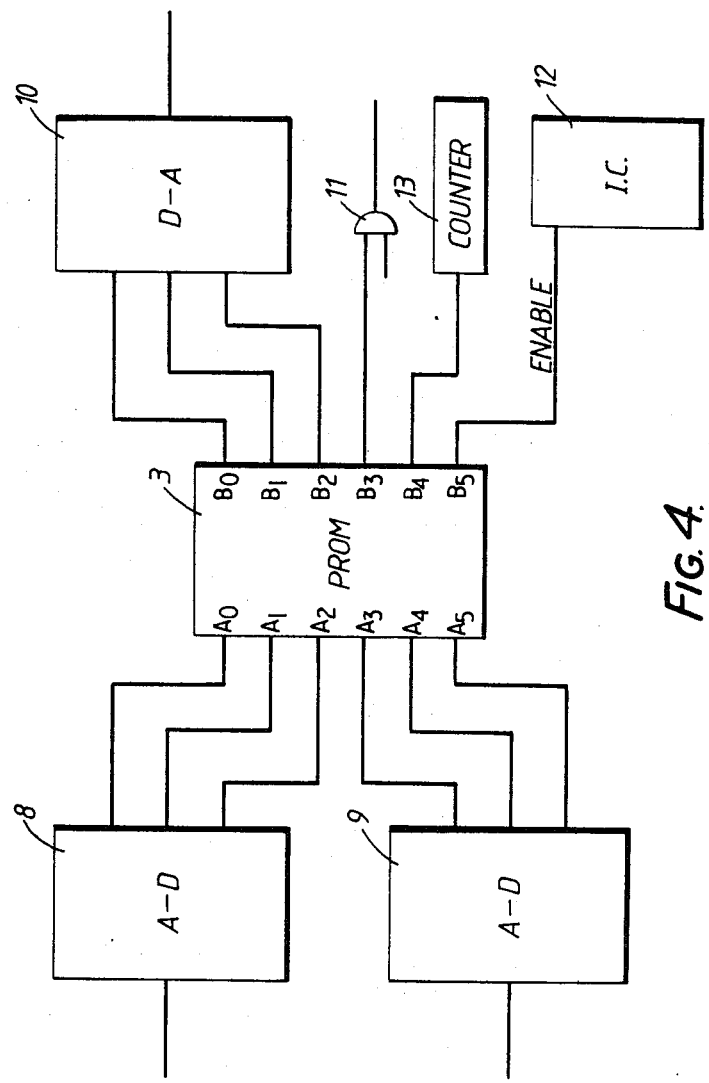

Referring to FIG. 4 an alternative use of the PROM 3 will now be described. In the use now to be described the address inputs Ao-An are divided in to two groups each n long.

By applying a first digital value to the address inputs Ao to An and a second digital value to the other address inputs and programming the addressed memory words according to the difference between the two values, the two digital values may be scaled against each other to provide a digital output on the leads Bo-Bn which output may be used for any control purpose.

Thus, if two different voltages are applied to respective analogue to digital converters (8, 9) using the digital signals to address the PROM 3 the voltages may be scaled against one another.

The equality of the voltage may produce a '1' output on one or more of the output leads Bo-Bn while one different (say one voltage greater than the other) produces a particular digital output and another difference (say the other voltage being greater than the first said one) produces a different particular digital output. The digital output may also be varied in dependance on voltage difference as well as a simple "greater or lesser" comparison.

The digital output signals on the leads Bo-Bn may of course each be used to control a different part of a circuit since it is not essential that the PROM 3 be programmed in a logical numerical sequence. Thus as shown in FIG. 4 outputs Bo, Bl and B2 are connected to a digital to analogue converter 10 to provide an output analogue signal whilest outputs B3 and B5 provide enabling signals respectively to a logic gate 11 and another integrated circuit 12, the remaining output B4 being applied to an event counter 13.

We claim:

1. A control circuit comprising:
   (A) An addressable memory, said addressable memory having a first storage area comprising n/2 addressable words and a second storage area comprising n/2 addressable words;
   (B) addressing means to cause ouput of a word from said first storage area in dependence upon digital signals applied to address inputs of said addressable memory;
   (C) means to cause a change of addressing from the word addressed in said first storage area to a corresponding word in the second storage area to cause output of said corresponding word in place of the first said word;
   each of said n/2 addressable words in said first storage area representing a respective predetermined value and each of said n/2 addressable words in said second storage area representing a respective predetermined value; each of said respective predetermined values stored in said second storage area equalling a corresponding one of said respective predetermined values stored in the first storage area incremented by a fixed value, the circuit effecting a predetermined stepwise change in output value on change of addressing from one of said first or second storage areas to a corresponding one of said second or first storage areas.

2. A control circuit according to claim 1 in which said respective predetermined values stored in said n/2 addressable words of said first storage area are each equal in value to the address of the one of said n/2 addressable words in which the values are stored.

3. A control circuit according to claim 1 further comprising at least one other storage area comprising n/2 addressable words, each representing a respective predetermined value equalling said predetermined value represented by the corresponding word in said first storage area incremented by a second fixed value, said second fixed value having a different value to the first said fixed value, said addressing means effecting different predetermined stepwise changes in output value by switching between said storage areas.

4. A control circuit according to claim 1 further comprising a digital to analogue converter which has inputs connected to outputs of said addressable memory, said means to cause a change of addressing effecting a stepwise change in an ouput analogue voltage by switching between said first and said second storage areas.

5. A control circuit according to claim 3 further comprising a digital to analogue converter which has inputs connected to outputs of said addressable memory, said means to cause a change of addressing effecting a stepwise change in an output analogue voltage by switching between different ones of said storage areas.

6. A control circuit according to claim 4 in which said addressing means and said means to cause a change of addressing comprise respective outputs of a phase detector, said phase detector responding to an output signal from a voltage controlled oscillator on one of its inputs and a reference signal on another of its inputs to determine addressing of the first storage area or the second storage area, outputs of said digital to analogue converter are connected to inputs of said voltage controlled oscillator, said phase detector effecting stepwise changes in frequency of the output signal of said voltage controlled oscillator by switching between said first and said second storage areas.

7. A control circuit according to claim 5 in which said addressing means and said means to cause a change of addressing comprise respective outputs of a phase detector, said phase detector responding to an output signal from a voltage controlled oscillator on one of its inputs and a reference signal on another of its inputs to determine addressing of said storage areas, outputs of said digital to analogue converter are connected to inputs of said voltage controlled oscillator, said phase detector effecting changes in frequency of the output signal of said voltage controlled oscillator by switching between different ones of said storage areas.

* * * * *